United States Patent
Lambert et al.

(10) Patent No.: US 11,804,456 B2
(45) Date of Patent: Oct. 31, 2023

(54) WIREBOND AND LEADFRAME MAGNETIC INDUCTORS

(71) Applicant: Intel Corporation, Santa Clara, CA (US)

(72) Inventors: William J. Lambert, Tempe, AZ (US); Omkar Karhade, Chandler, AZ (US); Martin Rodriguez, Phoenix, AZ (US); Gregorio R. Murtagian, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1290 days.

(21) Appl. No.: 16/107,791

(22) Filed: Aug. 21, 2018

(65) Prior Publication Data
US 2020/0066659 A1    Feb. 27, 2020

(51) Int. Cl.
| H01L 23/64 | (2006.01) |
| H01L 23/522 | (2006.01) |
| H01L 23/495 | (2006.01) |
| H01L 49/02 | (2006.01) |

(52) U.S. Cl.
CPC ...... *H01L 23/645* (2013.01); *H01L 23/49582* (2013.01); *H01L 23/5226* (2013.01); *H01L 28/10* (2013.01)

(58) Field of Classification Search
CPC ... H01L 28/10; H01L 23/645; H01F 27/2823; H01F 27/2828
See application file for complete search history.

(56) References Cited

U.S. PATENT DOCUMENTS

| 5,543,773 A | * | 8/1996 | Evans | H01F 30/16 336/200 |
| 6,775,901 B1 | * | 8/2004 | Lee | H01L 23/645 366/200 |
| 6,998,952 B2 | * | 2/2006 | Zhou | H01F 17/0033 336/200 |
| 7,723,129 B2 | * | 5/2010 | Koduri | H01L 24/16 438/126 |
| 8,701,272 B2 | * | 4/2014 | Lotfi | H02M 3/003 29/841 |
| 9,831,198 B2 | * | 11/2017 | Zhou | H01F 5/00 |
| 11,277,067 B2 | * | 3/2022 | Hong | H01L 25/00 |
| 2004/0208032 A1 | * | 10/2004 | Edo | H02M 7/003 363/147 |
| 2016/0372449 A1 | * | 12/2016 | Rusu | H01L 23/64 |
| 2016/0379747 A1 | * | 12/2016 | Wolter | H01L 23/5227 336/200 |

* cited by examiner

*Primary Examiner* — Mark W Tornow
*Assistant Examiner* — Abbigale A Boyle
(74) *Attorney, Agent, or Firm* — Essential Patents Group, LLP

(57) ABSTRACT

A microelectronics package, comprising a substrate comprising a first bondpad and a second bondpad over a dielectric. An inductor comprising at least one wire extends over the dielectric. The at least one wire has a first end coupled to the first bondpad and a second end coupled to the second bondpad, and an inductor core layer over the dielectric. The inductor core layer comprises a magnetic material. At least a portion of the inductor extends within the inductor core layer.

17 Claims, 10 Drawing Sheets

WIREBOND AND LEADFRAME MAGNETIC INDUCTORS

BACKGROUND

Integrated voltage regulator (IVR) technology is an efficient die and package architecture for managing disparate voltages required by the various functions encompassed by a microprocessor or other system on chip devices (SoC). Currently, IVR implementations in IC packages, such as fully-integrated voltage regulator (FIVR) topologies, rely on air-core inductors. Typically, the air-core inductors are off-die, either on, or embedded within, the package dielectric adjacent to the IC die. Industry trends and market pressures are forcing chip manufacturers to reduce package footprint with succeeding IC generations. Space for the embedded inductor is reduced as well, causing decreases in inductor performance. In particular, successively more compact air-core inductors have seen inductances diminish from generation to generation, resulting in declining quality factor (ratio of energy stored in the inductor's magnetic field to energy dissipated by resistive losses in the inductor windings). As a consequence, the overall efficiency of IVRs suffer as losses increase.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
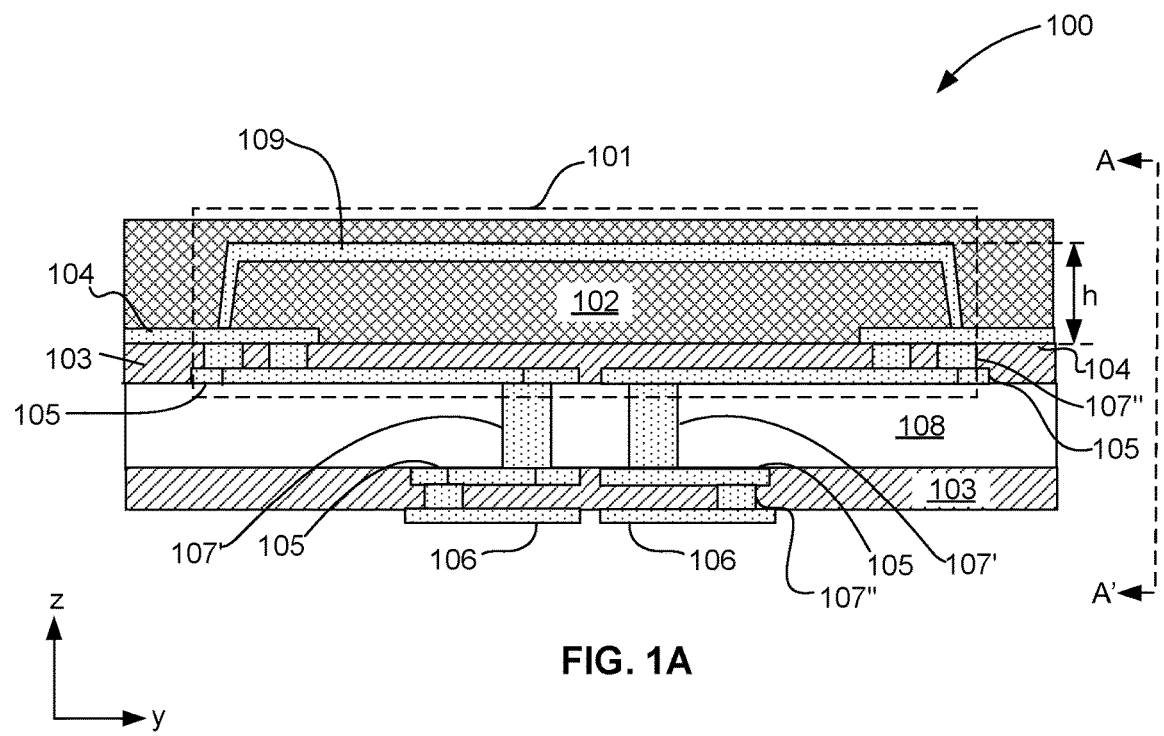
FIG. 1A illustrates a cross-sectional view in the y-z plane of a package substrate showing an integrated bondwire inductor, according to some embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Disclosed herein is a package-integrated magnetic inductor that can address one or more of the concerns above. In contrast to lithographically-defined inductors that are fabricated by patterning conductive layers within cored or coreless build-up package architectures, the inductors described herein comprise bondwires and/or leadframe wires. Such wirebond and leadframe package-integrated inductors afford a significant savings over lithographically-defined package-integrated inductors in terms of process time and cost, as multiple lithographic steps are eliminated.

According to embodiments, a package substrate may be fully or partially assembled by build-up processes to form conductive signal routing layers and via interconnects between conductive layers, interspersed with dielectric layers. At a specific package layer, a bondwire or leadframe wire is attached to conductive bondpads to form one or multiple inductors. The package layer at which this operation is performed may be the top conductive layer on the die side of the substrate, for example.

According to some embodiments, suitable wirebonding techniques may be employed to attach a bondwire between two open bondpads in a conductive layer of the package substrate. The attached bondwire is embedded in an inductor core layer comprising a magnetic material that may be formed by suitable methods. In some embodiments, the magnetic material is printed as an ink, or paste, comprising magnetic particles, over the inductor wire. The ink or paste is then cured to solidify into an inductor core layer over the dielectric of the package substrate.

In some embodiments, a package-integrated inductor unit comprises multiple parallel inductors, which comprise bondwires extending between opposing bondpads in two, or more, rows of adjacent bond pads. In some embodiments, the package-integrated inductor comprises two or more parallel bondwires extending between two bondpads and attached thereto. The multiple parallel bondwire arrangement may enhance current carrying capacity as well as inductance of the inductor.

In some embodiments, a leadframe wire is placed between two pads in an open conductive layer of a partially assembled package substrate and solder bonded to the pads. In some embodiments, the leadframe wire may be formed from metal (e.g., copper) sheet by stamping methods. Such leadframe wires may be stamped into any shape. Leadframe wires may in general have a larger cross section than bondwires, and generally will have a different cross-sectional shape (e.g., rectangular instead of circular). By virtue of the rectangular cross section, self-inductance may be tailored by providing wires by tailoring the aspect ratio of the cross section. For example, the self-inductance of the leadframe inductor may be increased by formation of a leadframe wire having a width that is several times the height. In general, larger self-inductance may be provided by increasing the cross-sectional aspect ratio. Self-inductance is also a function of the length of the wire.

From the perspective of fabrication and device performance, an advantage of the presently described inductor architectures is that the length of the inductors may be tuned to provide a particular self-inductance according to needs of the IC device to which the inductor is coupled. By way of example, a wirebond inductor to be coupled to an integrated voltage regulator circuit, such as a FIVR circuit, may be tuned for integration with a microprocessor die that is attached to the package substrate. The FIVR may be coupled to a particular voltage rail of the microprocessor, and tested ahead of the wirebonding process for optimal performance as a function of inductor self-inductance. Once the optimal inductance value is found, the inductor self-inductance may be tuned to that value by selecting the bondwire length. In a similar fashion, a leadframe wire length may be adjusted to provide a desired inductance. The tuning process may be repeated for each voltage rail. In this manner, maximal performance of the voltage regulators may be achieved since the inductors are optimal.

Throughout the specification, and in the claims, the term "connected" or "interconnected" means a direct connection, such as electrical, mechanical, or magnetic connection between the things that are connected, without any intermediary devices.

Here, the term "coupled" means a direct or indirect connection, such as a direct electrical, mechanical, or magnetic connection between the things that are connected or an indirect connection, through one or more passive or active intermediary devices.

Here, the term "package" generally refers to a self-contained carrier of one or more IC dies, where the dies are attached to the package substrate, and encapsulated for protection, with integrated or wire-boned interconnects between the die(s) and leads, pins or bumps located on the external portions of the package substrate. The package may contain a single die, or multiple dies, providing a specific function. The package is usually mounted on a printed circuit board for interconnection with other packaged ICs and discrete components, forming a larger circuit.

Here, the term "substrate" refers to the substrate of an IC package. The package substrate is generally coupled to the die or dies contained within the package, where the substrate comprises a dielectric having conductive structures on or embedded with the dielectric. Throughout this specification, the term "package substrate" is used to refer to the substrate of an IC package.

Here, the term "core" generally refers to a stiffening layer generally embedded within the package substrate, or comprising the base of a package substrate. In many IC package architectures, a core may or may not be present within the package substrate. A package substrate comprising a core is referred to as a "cored substrate". A package substrate is generally referred to as a "coreless substrate". The core may comprise a dielectric organic or inorganic material, and may have conductive vias extending through the body of the core.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "microprocessor" generally refers to an integrated circuit (IC) package comprising a central processing unit (CPU) or microcontroller. The microprocessor package may comprise a land grid array (LGA) of electrical contacts, and an integrated heat spreader (IHS). The microprocessor package is referred to as a "microprocessor" in this disclosure. A microprocessor socket receives the microprocessor and couples it electrically to the PCB.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1A illustrates a cross-sectional view in the y-z plane of package substrate 100 showing integrated wirebond inductor 101, according to some embodiments of the disclosure.

In FIG. 1A, a profile view of wirebond inductor 101 integrated into package substrate 100 is shown. Wirebond inductor 101 is embedded in inductor core layer 102 over package dielectric 103 and coupled to bondpads 104. In the illustrated embodiment, package substrate 100 is a cored substrate, where package dielectric 103 is over package core 108. Other conductive structures such as traces may be coupled to wirebond inductor. In some embodiments, bondpads 104 are in the top conductive layer of package substrate 100, and wirebond inductor 101 extends above (in the z-direction) package dielectric 103. In some embodiments, bondpads 104 are on the land side of package substrate 100. In some embodiments, bondpads 104 are on the die side of package substrate 100. As such, wirebond inductor 101 should be distinguished from a wirebond with ends that couple to two different substrates, or between a substrate and an IC die.

In some embodiments, package substrate 100 is a single-layer cored or coreless substrate. In some embodiments, package substrate 100 is a multi-layer cored or coreless substrate. In the illustrated embodiments, package substrate 100 comprises a single build-up film laminate layer (e.g., package dielectric 103) over package core 108. In some embodiments, multiple film layers comprising a suitable package dielectric material may be laminated one at a time over a rigid package core to form a stack of overlaid laminates of package dielectric. For formation of cored package substrates, package core 108 is a rigid component upon which the substrate is built.

An example is a package substrate formed by bumpless build-up layer (BBUL) methodology. The term "bumpless" refers to dielectric layers of substrate and components and conductive structures embedded within the dielectric layers, where no solder balls or bumps are used as means of attachment.

In some embodiments, package dielectric 103 comprises composite epoxies, crystalline polymers, polyamides or polyimides. Other suitable package dielectric materials may be used. In some embodiments, package dielectric 103 comprises dielectric film laminate layers having thicknesses ranging from 20 to 40 microns. In some embodiments, all layers have the same thickness. In some embodiments, variable thickness dielectric film laminate layers may be overlaid. In some embodiments, overlaid laminate films have different thicknesses, as shown in the illustrated embodiment of FIG. 1A. As several laminates may be overlaid, package dielectric 103 has a thickness that ranges from 100 to 1500 microns.

Conductive layers may be formed over each dielectric layer. Vias may interconnect conductive layers. Through-vias 107' extend through package core 108 to couple conductive structures on one side of package core 108 to conductive structures on the opposite side of package core 108. A first conductive layer comprising traces 105 is over package core 108. Vias 107" extend through dielectric 103 on both sides of package core 108 and electrically couple traces 105 to bondpads 104 on one side of package substrate 100 and to bondpads 106 on the opposing side of package substrate 100. In the illustrated embodiment, dielectric 103 comprises a single laminate layer. In some embodiments, dielectric 103 comprises multiple laminate layers. Conductive structures (e.g., bondpads 104 and 106, traces 105 and vias 107' and 107") comprise any of copper, gold, silver, molybdenum or tungsten. In general, conductive structures are formed by electroplating or electroless deposition methods. An example of an electrodeposition method is described below.

Embedded conductive layers (e.g., traces 105) are at the boundary between laminate dielectric layers, including package core 108. In some embodiments, bondpads 106 are on the top, or die side of package substrate 100. During operation of a packaged device, vias 107' are to convey signals from the land side of package substrate 100 to higher conductive layers (e.g., toward the die side of package substrate 100). Signals may also be routed within embedded conductive layers through traces 105.

In some embodiments, wirebond inductor 101 comprises at least one bondwire trace 109 (differentiated from a lithographically-defined trace that is generally flush with a package dielectric layer and will not typically have the same cross-section as a bond wire) of the type used for wirebonding IC dies to package substrates. In the illustrated embodiment, a single bondwire trace 109 is shown. In some embodiments, wirebond inductor 101 comprises two or more bondwire traces. In some embodiments, bondwire trace 109 has a diameter that ranges between 8 microns to 500 microns. For small diameter-to-length ratios, self-inductance of a single wire has a small dependence on wire diameter. In some embodiments, wirebond trace 109, hence wirebond inductor 101, has a length that ranges between 500 to 3000 microns. For large diameter bondwires (e.g., greater than 100 microns), wire diameter is a significant fraction of the length, hence the self-inductance may be a stronger function of wire diameter. Wire diameter also affects wire resistance.

Thicker wires have lower electrical resistance, thus can more readily carry larger currents. As an example, peak currents of up to 30 amperes may be demanded by a graphics processing unit, central microprocessor, or a similarly complex IC device. By way of example, a 500-micron diameter bondwire corresponds to a 24 American Wire Gauge (AWG) wire, which is rated to safely carry up to 3.5 amperes. Multiple wirebond inductors connected in parallel may be required to carry the full current. Wirebond inductor 101 may be attached to bondpads 103 by suitable wirebonding method, as described below.

In some embodiments, an inductor comprises a signal path between a first bondpad 106 coupled to a trace 105 through a first (left in the figure) via 107" on the die side of package core 108. The signal path continues to follow a first through-via 107' extending through package core 108 (on the left side in the figure) and conveying the signal loop therethrough. On the opposite (land) side of package core 108, the signal loop continues with a second via(s) 107" coupled to land side bondpad 104. The inductor continues through bondwire 109, which interconnects first and second bondpads 104.

The inductor comprises a second via(s) 107" on the right side of the figure, which couple bondpad 104 to trace 105. A second through-via 107' (right side of the figure) returns the signal path to the die side of package substrate 100, where the inductor loop exits package substrate 100 through a second bondpad 106 (on the right side of the figure). In some embodiments, bondpads 106 couple the inductor loop to a FIVR circuit on an attached IC die (not depicted), where contacts on the IC die are solder bonded to bondpads 106.

In some embodiments, wirebond inductor 101 is part of an array of multiple parallel wirebond inductors (see FIG. 1B) embedded within inductor core layer 102. FIG. 1A may present a profile view of such an array, which is further shown in FIG. 1B. In some embodiments, inductor core layer 102 has a thickness (z-height) ranging between 100 and 150 microns. In some embodiments, inductor core layer 102 extends to a z-height of up to 150 microns over package dielectric 103. In contrast, a magnetic inductor array (MIA) might require at least 220 microns of magnetic core thickness to achieve the same inductance density of an array of wirebond inductor 101.

The inductance density is a function of the permeability of the magnetic core material in inductor core layer 102 and the number of inductors within the inductor core layer 102. A MIA is a discrete inductive component that is attached to the land side of a package substrate. In many implementations, a MIA is coupled to voltage regulation circuitry (e.g., an integrated voltage regulator, IVR) on an attached microprocessor die. The extra thickness of the MIA required to achieve a desired inductance density adds to the overall z-height of the finished package. Each inductor in a MIA array is surrounded by a dielectric within the magnetic core, which reduces the inductance density. In contrast, the wirebond inductor 101 has no dielectric shell surrounding it, and can be in contact with the material of inductor core layer 102, as shown. Hence, a thicker magnetic core (e.g., 220 microns) is typically required for the MIA to have the same inductance density of a wirebond inductor array in accordance with some embodiments herein. Hence, the wirebond inductor architecture may enable a core layer thickness that is significantly (e.g., 70 microns) less than for a MIA.

In some embodiments, wirebond inductor 101 bends or deflects at, or between, both ends permitting the intervening portion of the wirebond to extend above the level of the package dielectric 103. Deflection of the wire may be a consequence of a wirebonding process and can be controlled to produce a specific bend angle and z-height. In some embodiments, wirebond inductor 101 extends a z-height h over package dielectric, where h ranges between zero to 150 microns. In some embodiments, h is greater than one half of the z-height of inductor core layer 102. In such embodiments, wirebond inductor 101 is asymmetric with respect to inductor core layer 102. In asymmetric configuration embodiments, wirebond inductor 101 is further away from conductors on the top of and within package dielectric 103. Asymmetric configurations of wirebond inductor 101 may provide greater inductance in comparison with symmetric configurations, as flux area within the asymmetric reluctance path in the magnetic core is increased within the gap between the inductor wire 109 and package dielectric 103. Flux may couple to conductive structures within package dielectric 103, such as traces 105 that conduct signal current to wirebond inductor 101, increasing loop inductance. In some embodiments, inductor core layer 102 has a relative permeability ranging between 5 and 20.

In some such embodiments, inductor core layer 102 comprises magnetic particles within a neutral (non-magnetic, non-conductive) matrix. In some embodiments, the matrix is a thermoplastic or thermosetting organic polymer comprising epoxy resins, polyamide resins, polyimide resins, polysulfones. Inorganic materials such as silica filler, silicates, may also be included.

Suitable magnetic particulate materials include, but are not limited to, any of iron, nickel, cobalt, manganese, molybdenum or alloys thereof (e.g., nickel-iron alloys such as Mu metals and/or permalloys). In some embodiments, magnetic materials comprise lanthanide and/or actinide elements. In some embodiments, inductor core layer 102 comprises cobalt-zirconium-tantalum alloy (e.g., CZT). Suitable magnetic materials may also comprise semiconducting or semi-metallic Heusler compounds and non-conducting (ceramic) ferrites. In some embodiments, ferrite materials comprise any of nickel, manganese, zinc, and/or cobalt cations, in addition to iron. In some embodiments, ferrite materials comprise barium and/or strontium cations. Heusler compounds may comprise any of manganese, iron, cobalt, molybdenum, nickel, copper, vanadium, indium, aluminum, gallium, silicon, germanium, tin, and/or antimony. Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, V, Ru, Cu2MnAl, Cu2MnIn, Cu2MnSn, Ni2MnAl, Ni2MnIn, Ni2MnSn, Ni2MnSb, Ni2MnGa Co2MnAl, Co2MnSi, Co2MnGa, Co2MnGe, Pd2MnAl, Pd2MnIn, Pd2MnSn, Pd2MnSb, Co2FeSi, Co2FeAl, Fe2VAl, Mn2VGa, Co2FeGe, MnGa, MnGaRu, or Mn3X, where 'X' is one of Ga or Ge.

Materials such as Pt, Pd, W, Ce, Al, Li, Mg, Na, Cr2O3, CoO, Dy, Dy2O, Er, Er2O3, Eu, Eu2O3, Gd, Gd2O3, FeO, Fe2O3, Nd, Nd2O3, KO2, Pr, Sm, Sm2O3, Tb, Tb2O3, Tm, Tm2O3, V, V2O3 or epoxy material with particles of a magnetic alloy. A magnetic alloy can be an alloy formed of one or more of: Pt, Pd, W, Ce, Al, Li, Mg, Na, Cr, Co, Dy, Er, Eu, Gd, Fe, Nd, K, Pr, Sm, Tb, Tm, or V.

Figure 1B:
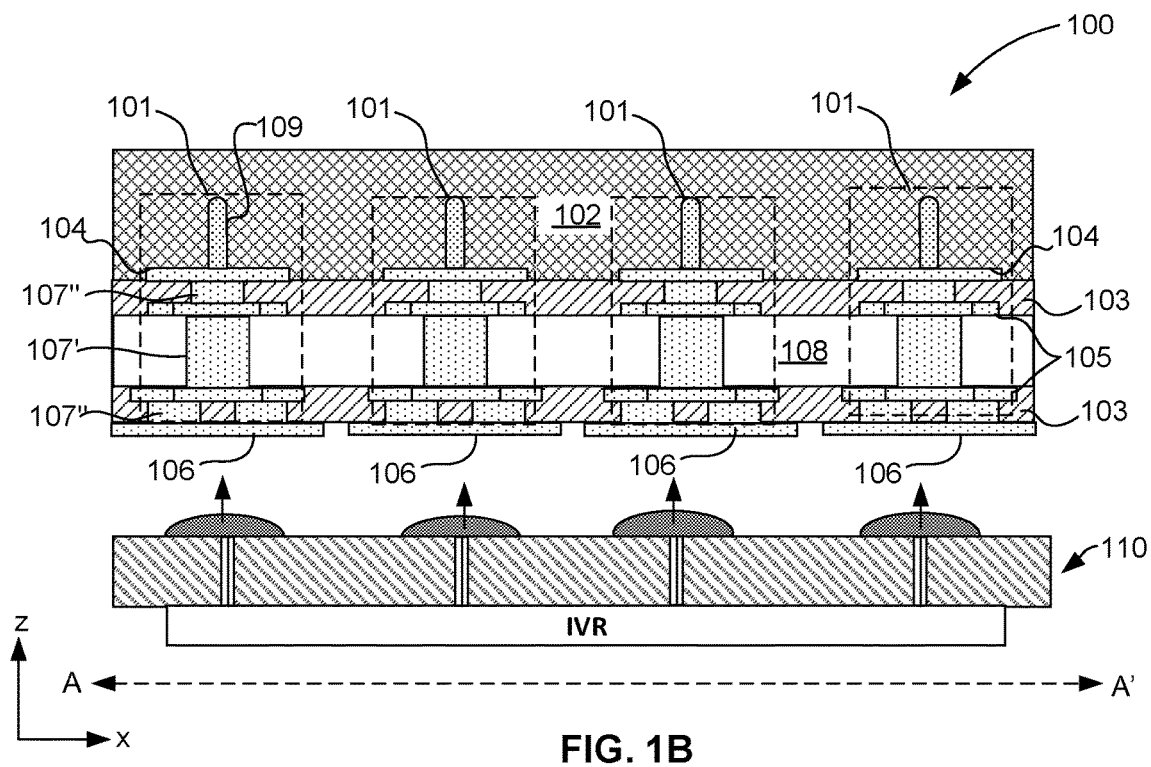
FIG. 1B illustrates a cross-sectional view in the x-z plane of a package substrate, showing an array of multiple integrated parallel wirebond inductors, according to some embodiments of the disclosure.

FIG. 1B illustrates a cross-sectional view in the x-z plane of package substrate 100, showing an array of multiple integrated parallel wirebond inductors 101, according to some embodiments of the disclosure.

In FIG. 1B, the profile view is taken along plane A-A' in FIG. 1A, and is rotated 90° from the cross-sectional view of FIG. 1A. Multiple wirebond inductors 101 are arranged in an array, where adjacent inductors 101 extend in a parallel orientation through magnetic core 102. In some embodiments, each wirebond inductor 101 is coupled in electrical parallel to a single signal source or coupled to separate signal sources. In some embodiments, the signal sources are integrated voltage regulators (IVRs) that are on a die 110 attached to package substrate 100. The wirebond inductors 101 comprise the inductor wire 109 coupled to voltage regulation circuitry, forming the inductive component. When operated, current is supplied as pulsed direct current (dc). Typical pulse frequencies are above 100 MHz, and may formed by switching transistors coupled to the input side of the wirebond inductors 101.

In some embodiments, individual wirebond inductors 101 have an inductance of 5-7 nanohenries (nH). The particular value of inductance depends on the length of the wirebond and the relative permeability of magnetic core 102. A parallel inductor topology where multiple wirebond inductors 101 are coupled in electrical parallel to a single signal source in general may have a smaller inductance than any of the individual inductors. Inductors may be coupled in parallel to handle currents that are too large to be handled safely by any individual inductor. For parallel topologies, the inductance of the individual inductors may be adjusted by choice of length and diameter to maintain a minimum self-inductance for each inductor.

In comparison to MIA inductors, wirebond inductors 101 have enhanced performance. By way of example, a comparison may be made between MIA inductors and wirebond inductors 101 having similar dimension. A MIA inductor can have an overall inductance of 2.5 nH, whereas a wirebond inductor 101 of the same dimensions has an overall inductance of 6 nH. The difference may be primarily due to a dielectric envelope surrounding the MIA inductor, which negatively impacts the self-inductance of the MIA inductor. For the same wirebond inductor 101, ac resistance may be approximately 300 milliohms compared to 150 milliohms for a MIA inductor. The enhanced self-inductance of wirebond inductors 101 afford a higher Q (quality factor) of approximately 17 for inductors 101, compared to a Q of approximately 14 for a typical MIA inductor. The higher Q affords higher overall efficiency for the IVRs to which wirebond inductors 101 are coupled.

In some implementations, multiple wirebond inductors 101 are coupled independently to IVR circuitry. As an example, four wirebond inductors 101 are coupled to independent switching transistor pairs in buck regulator circuits, generating pulsed dc currents that are phased. Each wirebond inductor 101 carries a radio frequency (rf) current of 140 MHz, differentially phased, to a load circuit in the IVR. Load shunt capacitance in the IVR circuitry is coupled to each wirebond inductor 101, and together the relatively high self-inductance value of wirebond inductor 101, filters the current to reduce the pulses to a relatively low value of ripple (e.g., 20%) superimposed on a pure dc component.

The amount of ripple voltage or current may be reduced to a suitable predetermined level by choice of the value of self-inductance of wirebond inductors 101, and shunt capacitance values. For any self-inductance value of wirebond inductor 101 (mostly determined by the length of the inductor 101 and relative magnetic permeability of inductor core layer 102), any dissipative losses incurred by the bondwire are compensated by the relatively high inductance density, increasing the Q of the wirebond inductors 101 over that of a typical MIA. The proximity of the parallel wirebond inductors 101 within inductor core layer 102 permit a high level of magnetic coupling between the inductors, as current may be flowing in the same direction through each inductor 101.

Inductance density within the inductor unit comprising inductor core layer 102 and the array of wirebond inductors 101 is enhanced by the parallel arrangement and close proximity of the inductors 101. Current flowing in the same direction in each of the wirebond inductors 101 enable positive mutual inductance to add to the self-inductance of the individual wirebond inductors 101. The combination of a high mutual inductance and relatively high self-inductance of the individual wirebond inductors 101 enable a high inductance density for the array of wirebond inductors 101. The inductance density may be greater than the inductance density of found in a typical MIA, as described above.

An advantage afforded by the wirebond inductors is that various inductor architectures may be easily realized by formation of wirebond traces (e.g., wirebond trace 109) without the need for lithographic methods. Wirebond inductor architecture is flexible. Two such embodiments are described below, however persons skilled in the art will appreciate that other wirebond inductor embodiments are also possible.

Figure 2A:
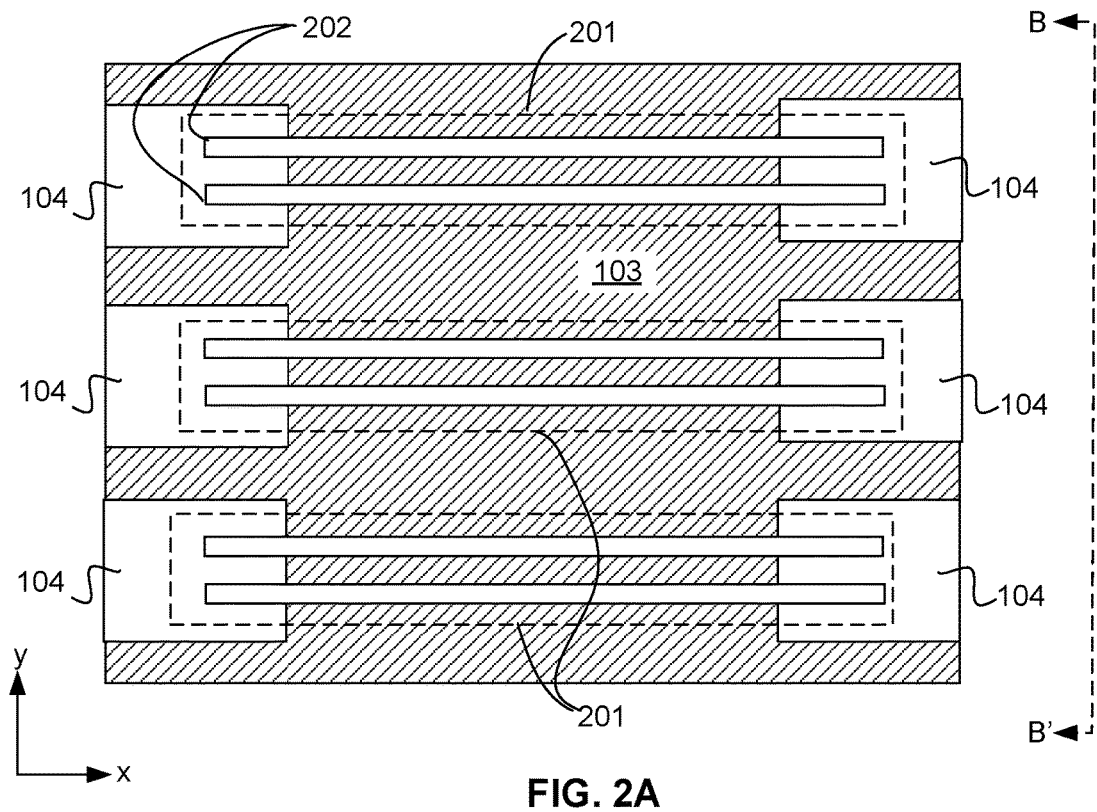
FIG. 2A illustrates a plan view in the x-y plane of wirebond inductors with dual wirebond traces, integrated in a package substrate, according to some embodiments of the disclosure.

FIG. 2A illustrates a plan view in the x-y plane of wirebond inductors 201 with dual wirebond traces, integrated in package substrate 100, according to some embodiments of the disclosure.

In FIG. 2A, wirebond inductors 201 (delineated by dashed rectangles) comprise dual wirebond traces 202 spanning bondpads 104 across package dielectric 103. Wirebond traces 202 are substantially parallel in both geometric layout and electrical connectivity. Dual wirebond traces 202 extend over package dielectric 103 and are coupled electrically to bondpads 104, and as such are coupled together in parallel. While the illustrated embodiment shows two parallel wirebond traces 202 for each wirebond inductor 201, in some embodiments, wirebond inductors 201 comprise three or more wirebond traces 202.

In some embodiments, wirebond inductors 201 extend through a magnetic core layer (e.g., inductor core layer 102). For clarity, a magnetic core layer is not shown in FIG. 2A, but is shown in the profile views of FIGS. 2B and 2C. Wirebond traces 202 may be attached to bondpads 104 by conventional suitable wirebonding methods, as described in greater detail below. As for the single trace wirebond inductors 101 in FIGS. 1A and 1B, inductance may be tuned to optimal values during assembly. Dual wirebond traces 202 are electrically coupled in parallel and reduce the overall self-inductance of wirebond inductors 201 in comparison to a single trace wirebond inductor (e.g., wirebond inductor 101). Wirebound Traces 202 have positive mutual inductance when carrying current in the same direction. The parallel configuration reduces the ac resistance by a factor of less than two, which scales more rapidly than the inductance. Due to this effect, the Q of wirebond inductors 201 is increased over single trace wirebond inductors 101.

A particular advantage of wirebond inductors 201 having two or more wirebond traces 202 is the reduction in dissipative resistive losses relative to single-trace wirebond inductors that may be incurred by IVRs coupled to wirebond inductors 201. The Q of the inductor increases, as does the overall efficiency of the coupled IVR. In some embodiments, larger numbers of parallel wirebond traces 202 per inductor 201 have increasingly higher Q factors.

Figure 2B:
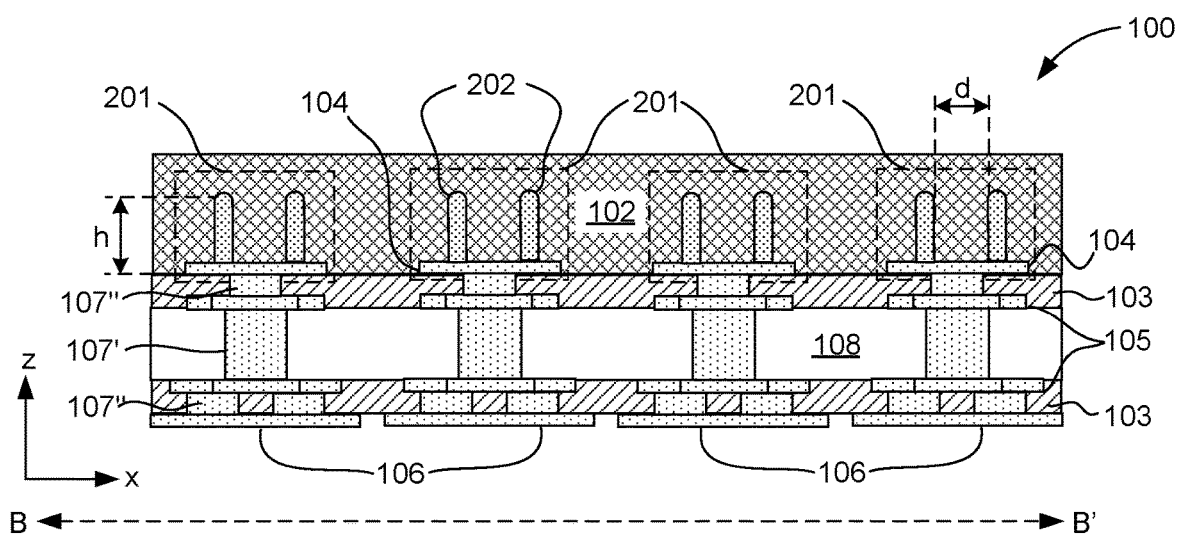
FIG. 2B illustrates a profile view in the x-z plane of wirebond inductors with dual wirebond traces, integrated in a package substrate, according to some embodiments of the disclosure.

FIG. 2B illustrates a profile view in the x-z plane of wirebond inductors 201 with dual wirebond traces, integrated in package substrate 100, according to some embodiments of the disclosure.

In FIG. 2B, an array of dual-trace wirebond inductors 201 is shown, where wirebond traces 202 extend within magnetic core 102 below the plane of the figure. The description of the general architecture of package substrate 100 is the same as the description given for FIGS. 1A and 1B. The reference numerals have the same meaning for FIG. 2B. The dashed rectangles delineate wirebond inductors 201. The view of FIG. 2B is taken from plane B-B' in FIG. 2A, looking at wirebond inductors 201 edge-on. The profile view shown vertical portions of two wirebond traces 202 per wirebond inductor 201 extending over dielectric 103 from bondpads 104. In some embodiments, wirebond traces 202 are spaced apart by a distance d. As wirebond traces 202 are in close proximity, the magnetic coupling between them is strong when currents are flowing. If currents flow in the same direction, magnetic coupling is positive, engendering a large value of mutual inductance. The coupling coefficient may be optimized by adjusting the distance d.

In some embodiments, wirebond inductors 201 extend within inductor core layer 102 over package dielectric 103 by a z-height h, where h ranges between zero and 150 microns. In some embodiments, inductor core layer 102 has a thickness ranging from 100 to 150 microns. A gap is between wirebond traces 202 and dielectric 103. Inductor core layer 102 surrounds the wirebond traces 202, and fills the gaps between wirebond traces 202 and dielectric 103. Inductor core layer 102 comprises magnetic materials, for example as described in detail above (see discuss related to FIGS. 1A and 1B). In some embodiments, inductor core layer 102 has a relative permeability ranging between 5 and 20.

Figure 2C:
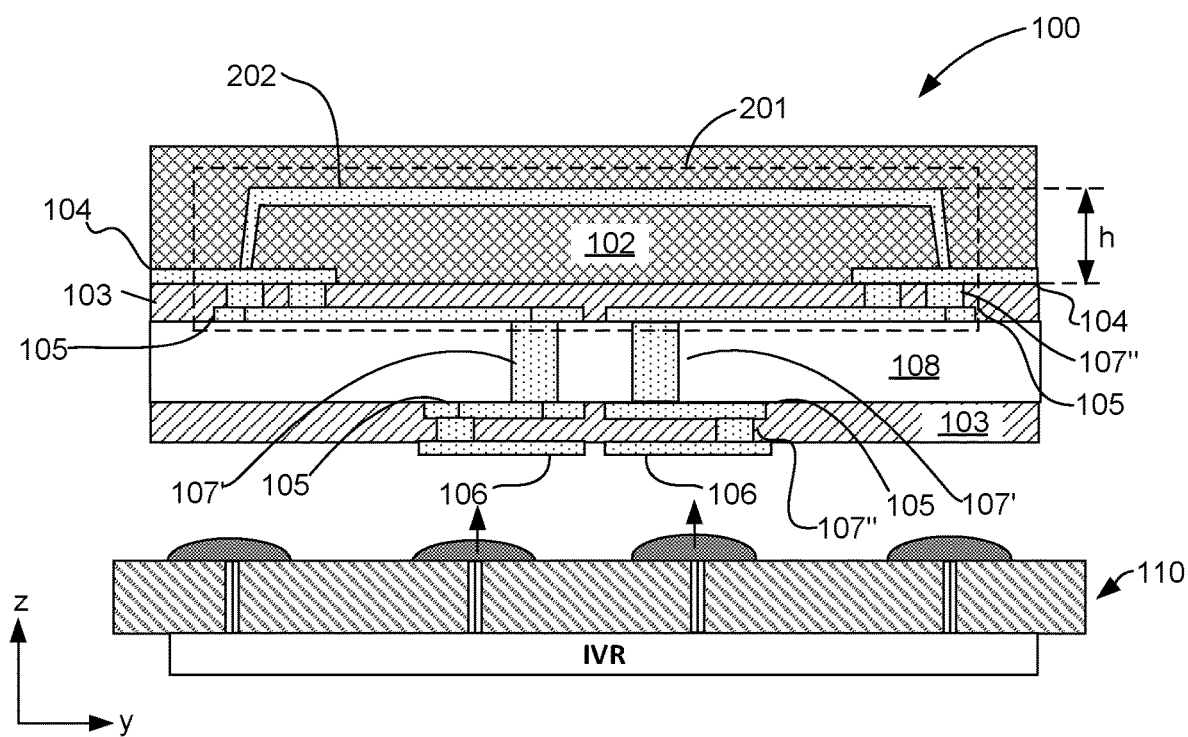
FIG. 2C illustrates a profile view in the y-z plane of a package substrate showing dual-trace wirebond inductors in profile view, according to some embodiments of the disclosure.

FIG. 2C illustrates a profile view in the y-z plane of package substrate 100 showing dual-trace wirebond inductors 201 in profile view, according to some embodiments of the disclosure.

In the profile view of FIG. 2C, dual-trace wirebond inductor 201 is shown n profile, delineated by the dashed rectangle. Two parallel wirebond traces 202 that extend through inductor core layer 102 are present, but only one trace in the plane of the figure is observable. The wirebond trace 202 below the plane of the figure is obscured. In general, the description of single-trace wirebond inductor 101 is applicable to dual-trace wirebond inductor 201. As described above for single-trace wirebond inductors 101, a inductor loop is formed by dual-trace wirebond inductors 201 and conductive structures within package substrate 100.

Wirebond traces 202 may be symmetric or asymmetric with respect to the z-height of inductor core layer 102. If z-height h of wirebond traces 202 is greater than half the z-height of inductor core layer 102, then wirebond inductor 201 is asymmetric with respect to inductor core layer 102. In asymmetric configuration embodiments, wirebond inductor 201 is further away from conductors on the surface of and within package dielectric 103. Asymmetric configurations of wirebond inductor 201 may provide greater inductance in comparison with symmetric configurations, as flux area within the magnetic core is increased below wirebond traces 202.

As noted above, an advantage of dual-trace wirebond inductor 201, as well as for single trace wirebond inductor 101, is that the inductance may be tuned at the time of package assembly. By way of example, die 110 may be attached to package substrate 100. In some embodiments, die 110 is a microprocessor. IVRs coupled to power rails on die 110 may be pre-tested by placement of package substrate 100 in a probe station, where the optimal inductance for each IVR may be determined. With the knowledge of the optimal inductance values for the particular circuit, the length of wirebond traces 202 may be calculated and programmed into a wirebond station, where the length of wirebond traces 202 may tuned to match the target inductance values for the die. In this manner, the inductances may be tuned for each package.

Figure 3A:
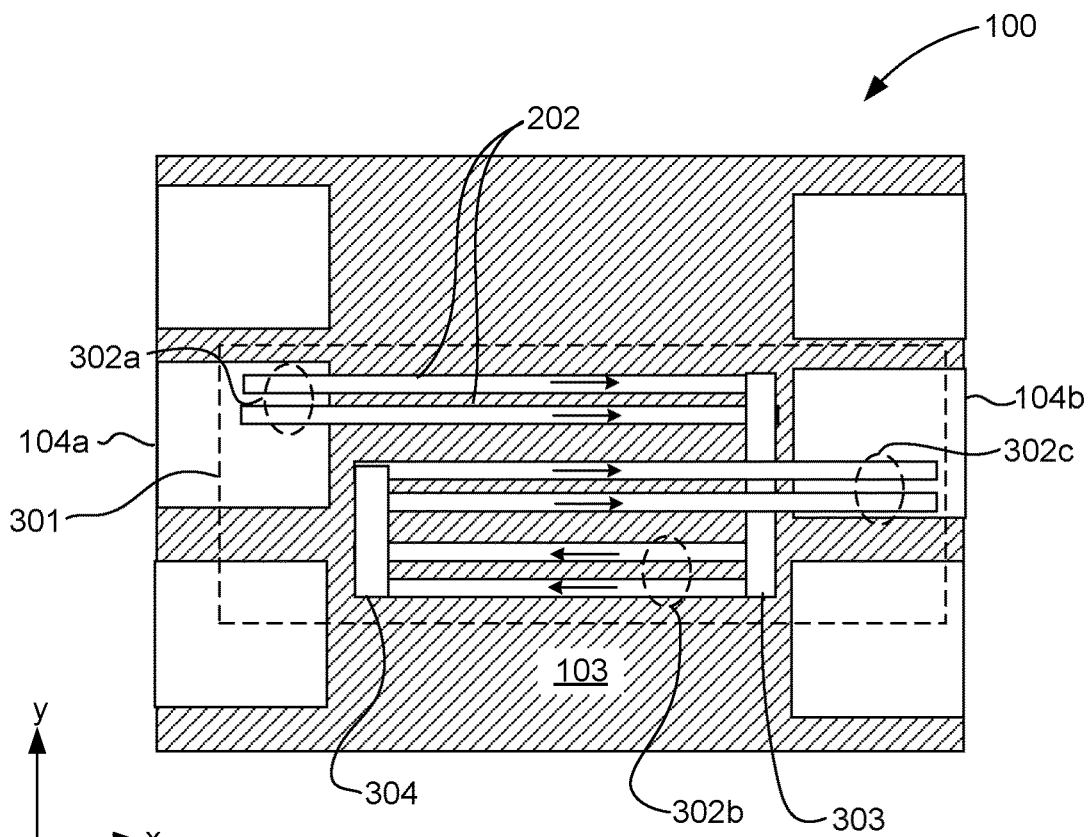
FIG. 3A illustrates a plan view in the x-y plane of a wirebond spiral inductor integrated into a package substrate, according to some embodiments of the disclosure.

FIG. 3A illustrates a plan view in the x-y plane of wirebond spiral inductor 301 integrated into package substrate 100, according to some embodiments of the disclosure.

In FIG. 3A, wirebond spiral inductor 301 is shown over package dielectric 103. Inductor core layer 102 is removed in FIG. 3A to show wirebond spiral inductor 301, which extends through a magnetic core according to some embodiments. As an example, a three-turn inductor as illustrated in FIG. 3A exhibits a significant increase in inductance over a single-turn dual-trace wirebond inductor (e.g., wirebond inductor 201).

In some embodiments, wirebond inductors (e.g., wirebond inductor 101 and 201) may require larger inductances than are possible with a single-trace inductor (e.g., wirebond inductor 101). Spiral inductor 301 comprises multiple turns of wirebond traces 302. In the illustrated embodiment, spiral inductor 301 comprises three (coil) turns: first, second and third coil turns 302a, 302b and 302c, respectively (collectively, coil turns 302). In some embodiments, coil turns 302 comprise dual wirebond traces 202, as shown in FIG. 3A. In some embodiments, coil turns 302 comprise a single wirebond trace (not shown, but comparable to wirebond trace 101 in FIG. 1A). In some embodiments, coil turns 302 comprises three of more traces.

In some embodiments, first coil turn 302a comprising wirebond traces 202 extends from first contact pad 104a to first bus trace 303, which extends perpendicularly from coil turn 302a along package dielectric 103. A second coil turn 302b, also comprising wirebond traces 202, extends between first bus trace 303 and second bus trace 304. Third coil turn 302c extends from second bus trace 304 to terminate at second contact pad 104b. Here, coil turn 302c bypasses first bus trace 303 as it extends in the z-direction over package dielectric 103 to terminate at bondpad 104b on the right side of the figure. In some embodiments, coil turns 302 are parallel. In some embodiments, spiral inductor 301 comprises four or more coil turns 302 for increased inductance over the three-turn configuration. In some embodiments, bus traces 303 and 304 are lithographically-defined copper structures over package dielectric 103.

Arrows drawn in FIG. 3A along wirebond traces 202 indicate current flow in an example implementation. In the illustrated example, current flow in the figure is from left to right. However, the magnetic coupling arising between the coil turns for the left-to-right current flow is the same for in the opposite sense, for right-to-left current flow. Regardless of the origin of the current, flow is in the same direction in coil turns 302a and 302c. Opposing current flows in coil turn 302b causes negative magnetic coupling between coil turns 302b and 302c. which have relatively strong coupling due to proximity. Negative magnetic coupling between coil turns 302a and 302b is weaker as these coil turns are spaced further apart. Positive magnetic coupling occurs between adjacent coil turns 302a and 302c but is weakened by the opposing field from turn 302b. As magnetic fields are partially cancelled, mutual inductance between coil turns 302a and 302c may be small, and the overall inductance of spiral inductor 301 is mostly determined by the self-inductance of wirebond traces 202.

In some embodiments, coil turns 302a and 302b are adjacent, and coil turn 302b between coil turns 302a and 302c. The net magnetic coupling is the same as in the illustrated spiral layout shown in FIG. 3A. The inductance of spiral wirebond inductor 301 may be several times that of single-turn wirebond inductors (e.g., wirebond inductor 101 in FIG. 1A). As an example, dual-trace spiral wirebond inductor 301 has an inductance of 11 nH, in contrast to a single-turn dual-trace wirebond inductor (e.g., wire bond inductor 201 in FIG. 2A) having an inductance of 3.45 nH. The inductance values depend on the relative permeability of the magnetic core layer (e.g., inductor core layer 102 in FIGS. 1A-2C), and the lengths of wirebond traces 202. For purposes of comparison, the length of the single turn wirebond inductor is equal to the length of any individual coil turn 302a-302c of the spiral wirebond inductors. The total length of the spiral wirebond inductor (sum of the lengths of individual coil turns 302a, 302b and 302c) is between two and three times the length of the single turn wirebond inductor to which it is compared.

The ac resistance of the same spiral wirebond inductor is also increased relative to the ac resistance of the single turn wirebond inductor. For example, the ac resistance of the same dual-trace spiral inductor is 520 milliohms compared to 180 milliohms for the dual-trace wirebond inductor. However, the Q of the spiral wirebond inductor is 18.5, contrasted to a Q of 16.9 for the single turn wirebond inductor. The ac resistance may be further decreased if coil turns 302a-302c comprise three or more wirebond traces 202. For implementations where larger inductances are required, a relatively high Q is maintained.

In some embodiments, bondpads 104a and 104b are land side contacts on the surface of package substrate 100. Bondpads 104a and 104b are coupled to die side contacts through vias (e.g., vias 107 in FIG. 2C) extending through package dielectric 103.

Figure 3B:
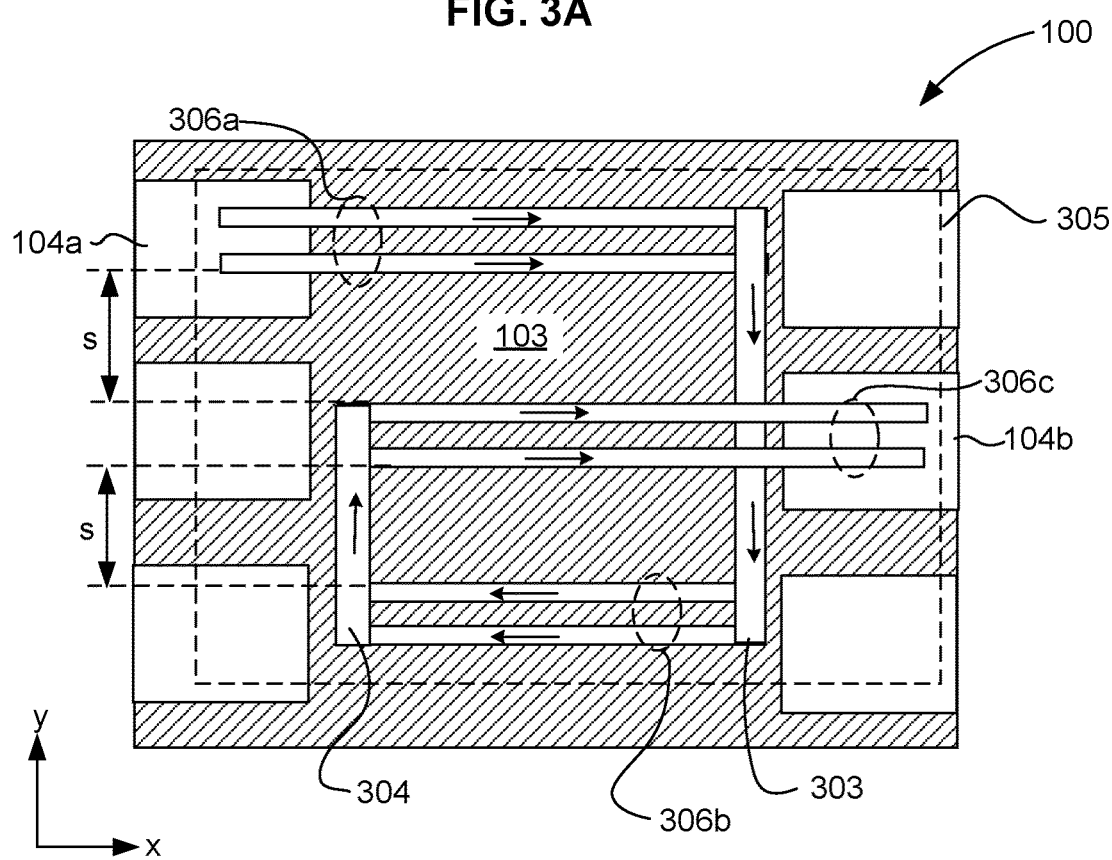
FIG. 3B illustrates a plan view in the x-y plane of a wirebond spiral inductor integrated into a package substrate, according to some embodiments of the disclosure.

FIG. 3B illustrates a plan view in the x-y plane of wirebond spiral inductor 305 integrated into package substrate 100, according to some embodiments of the disclosure.

For multiturn inductors, spacing between coil turns also influences the inductance of the inductor. Greater spacing lowers coupling, therefore decreasing mutual inductance between turns. Hence, the overall inductance is decreased. In FIG. 3B, spiral wirebond inductor 305 comprises coil turns 306a, 306b and 306c that have a greater inter-turn spacing than the inter-turn spacing of spiral wirebond inductor 301 shown in FIG. 3A. The overall inductance may be finely adjusted to a target value by adjusting the inter-turn spacing s.

Arrows drawn along wirebond traces 202 indicate an example of current flow along coil turns 306a-306c. Current may be introduced at bondpad 104a, from which coil turn 306a extends to bus trace 303. Current flows along bus trace 303 to coil turn 306b that extends between bus trace 303 and bus trace 304, along which it flows to bus trace 304 in a direction counter to that in coil turn 306a. Current then flows along bus trace 304 to enter coil turn 306b that extends from bus trace 304 to bondpad 104b, where current flows to bondpad 104b and exits spiral wirebond inductor 305.

Current flows along coil turn 306c in the same direction as current flow in coil turn 306a.

Magnetic coupling between coil turns 306a-306c is qualitatively the same as that described for spiral wirebond inductor 301 in FIG. 3A, however the degree of coupling (coupling coefficient) is smaller due to the increased spacing s.

Figure 4A:
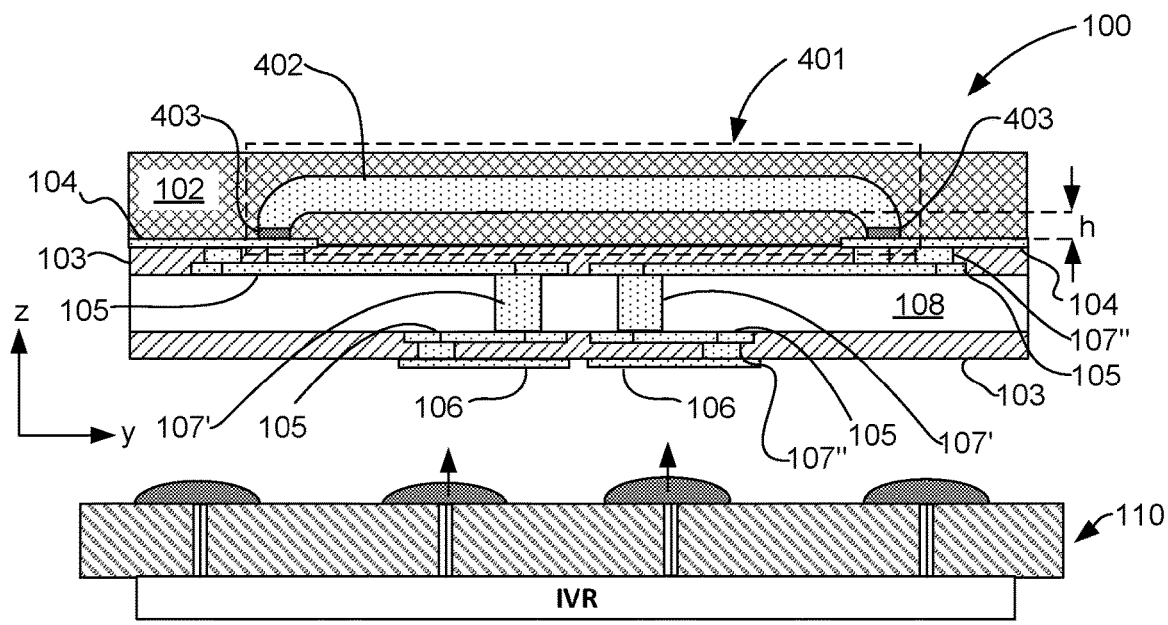
FIG. 4A illustrates a cross-sectional view in the y-z plane of a leadframe inductor, integrated in a package substrate, according to some embodiments of the disclosure.

FIG. 4A illustrates a cross-sectional view in the y-z plane of leadframe inductor 401, integrated in package substrate 100, according to some embodiments of the disclosure.

The cross-sectional shape and area of the wires that make up an inductor influences the inductance, ac (and dc) resistance, hence the Q, of the inductor. Rectangular cross sections may be manipulated by adjustment of cross-sectional dimensions. For package-integrated inductors, wires made from leadframe sheet metal that is used for form leadframes in IC packages may be formed to have appropriate dimensions for relatively large rectangular cross-section areas. Leadframe inductors may be employed for handling large currents in power management applications.

In FIG. 4A, the general architecture of package substrate 100 is the same as described in FIG. 1A. Reference numerals have the same meaning. Leadframe inductor 401, delineated by the dashed rectangle, is shown integrated on the land side of package substrate 100. Leadframe wire 402 extends through inductor core layer 102 between bondpads 104 on the land side of package dielectric 103. In some embodiments, leadframe wire 402 is formed from copper sheet metal used for making package leadframe components.

In some embodiments, leadframe wire 402 has a thickness in the z-direction ranging between 40 and 70 microns. By way of example, leadframe wire 402 has a thickness of 60 microns. In some embodiments, the width of leadframe wire 402 is the same as the thickness to make a square cross section. In some embodiments the width is greater than the thickness, where leadframe wire 402 has a flat or ribbon-like form factor. Inductance of leadframe wire 402 can be manipulated by controlling the cross section, in that the inductance of leadframe inductor 401 decreases as the aspect ratio of the cross section increases (smaller thickness relative to width). In some embodiments, leadframe wire 402 comprises copper.

In some embodiments, solder joints 403 intervene between leadframe wire 402 and bondpads 104. In some embodiments, bondpads 106 are on the die side of package substrate 100, and are coupled to leadframe inductor 401 through through-vias 107' and vias 107". In some embodiments, bondpads 106 are included in an array of contact pads for die attachment on package substrate 100.

In some embodiments, inductor core layer 102 has a z-height over package dielectric 103 on the land side of package core 108 ranging between 100 and 200 microns. In some embodiments, inductor core layer 102 has a z-height of 150 microns for a minimal impact on the overall z-height of the final package without compromising reducing the inductance. Inductor core layer 102 influences the inductance of leadframe inductor 401 by its permeability and dimensions, where higher values of both parameters increase the inductance.

Inductor core layer 102 comprises a finely divided magnetic material within a non-magnetic matrix. Compositional details of magnetic core 102 are described above (see description relating to FIG. 1A).

In some embodiments, leadframe inductor 401 has a bend at both ends permitting the long portion of leadframe wire 402 to extend above the level of the package dielectric 103. In some embodiments, leadframe wire 402 is substantially parallel to package dielectric 103. In some embodiments, leadframe wire 402 may be shaped by a stamping process, where the form factor may include bent legs at each end, as shown in FIG. 4A. The shape of leadframe wire 402 may be controlled by the stamp shape, and can be controlled to produce a specific bend angle and z-height.

An inductor loop is formed by leadframe wire 402 and conductive structures comprising land side bondpads 104, vias 107", traces 105, through-vias 107' and die side bondpads 106. The loop may be completed through IVR circuitry on die 110.

In some embodiments, leadframe inductor 401 extends a z-height h over package dielectric, where h ranges between zero to 150 microns. In some embodiments, h is greater than one half of the z-height of magnetic core block 102. In such embodiments, leadframe inductor 401 is asymmetric with respect to magnetic core 102. In asymmetric configuration embodiments, leadframe inductor 401 is further away from conductors on the top of and within package dielectric 103. As for wirebond inductors described above, asymmetric configurations of leadframe inductor 401 may provide greater inductance in comparison with symmetric configurations, as flux area within the magnetic core is increased below the inductor wire (e.g., leadframe wire 402). Magnetic coupling may occur between leadframe inductor 401 and copper structures within package dielectric 103.

A net increase in Q over a symmetric configuration may be a consequence of the asymmetric reluctance path. As an example, an asymmetric configuration of leadframe inductor 401 having a thickness of 60 microns and a gap h of 75 microns between leadframe wire 402 and package dielectric 103. In this example, magnetic core 102 has a z-height of 150 microns, and is 15 microns above leadframe wire 402. The Q of such a configuration is 19.2 (inductance of 2.83 nH), in contrast to a Q of 17.7 (inductance of 2.57 nH) for a symmetric configuration having a gap h of 45 microns (e.g., 45 microns of magnetic core above leadframe wire 402). Increasing h may result in more flux area, coupling flux to embedded traces 105 carrying signal current to leadframe inductor 401, increasing loop inductance.

Figure 4B:
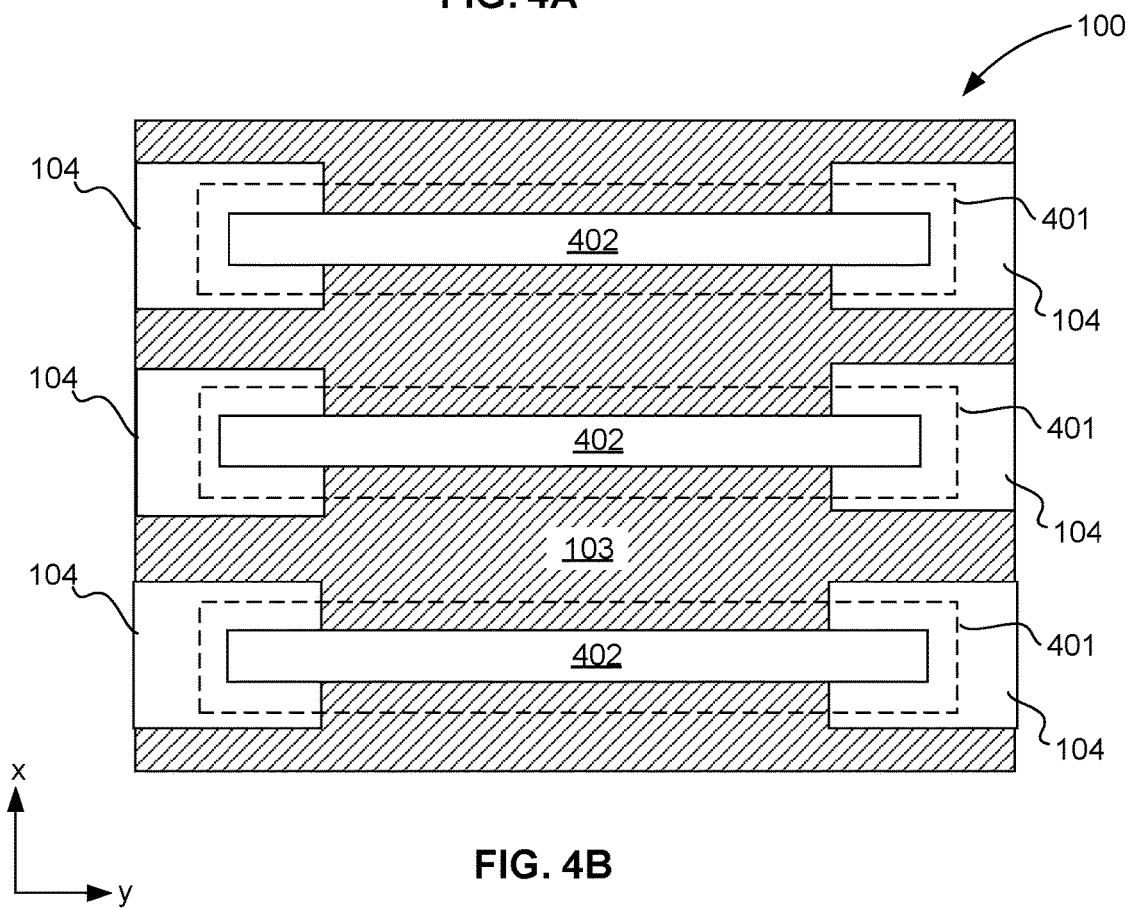
FIG. 4B illustrates a plan view in the x-y plane showing an array of leadframe inductors integrated in a package substrate, according to some embodiments of the disclosure.

FIG. 4B illustrates a plan view in the x-y plane showing an array of leadframe inductors 401 integrated in package substrate 100, according to some embodiments of the disclosure.

In FIG. 4B, the magnetic core (e.g., magnetic core 102) is removed to show multiple leadframe inductors 401, looking down on the landside of package substrate 100. Leadframe inductors 401 are integrated over package dielectric 103. In some embodiments, leadframe inductors 401 extend between bondpads 104 through a magnetic core (e.g., magnetic core 102, not shown), as shown in FIG. 4A. In some embodiments, leadframe wires 402 are bonded to bondpads 104 by solder joints (e.g., solder joints 403 in FIG. 4A).

In some embodiments, leadframe inductors 401 are parallel to each other. In some embodiments, leadframe inductors 401 are coupled in parallel to a common signal source. Current carrying capacity of leadframe inductors 401 is generally larger than wirebond inductors (e.g., wirebond inductors 101). As an example, a leadframe inductor having a cross section of 60×60 microns has a smaller equivalent cross-sectional area than AWG (American Wire Gauge) 40 wire. Such a wire can safely carry approximately 100 milliamperes of current. For large currents of several amperes, multiple leadframe wires 402 may be coupled in parallel to accommodate large currents. In some embodiments, bondpads 104 are contiguously joined to achieve parallel coupling of leadframe inductors 401.

In some embodiments, multiple leadframe inductors 401 are independently coupled to separate signal sources and loads. As an example, an IVR on an attached microprocessor die (e.g., die 110 in FIG. 4A) may provide phased 140 MHz pulsed dc current, where pulsed dc is provided by switching transistor pairs in the IVR circuitry. Each IVR signal source line is coupled to a separate leadframe inductor 401 in a buck converter topology.

FIGS. 5A-5H illustrate an exemplary method for forming integrated wirebond inductor 101, according to some embodiments of the disclosure.

Figure 5A:
FIGS. 5A-5H illustrate an exemplary method for forming an integrated wirebond inductor, according to some embodiments of the disclosure.

In the operation shown in FIG. 5A, package core 500 is received in an early stage of preparation. In some embodiments, package core 500 comprises a plated copper layer 501 on at least one side. Package core 500 has a thickness ranging between 100 and 500 microns. In some embodiments, copper layer 501 has a thickness ranging between 15 to 35 microns.

Figure 5B:
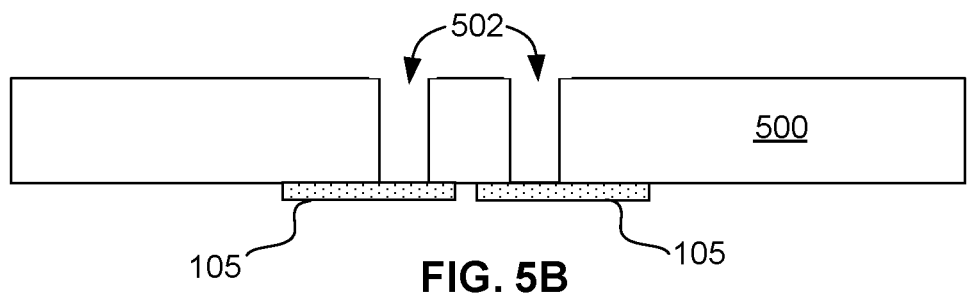

In the operation shown in FIG. 5B, copper layer 501 is patterned to form conductive structures (e.g., traces 105). In some embodiments, traces 105 are formed by lithographic methods. A photoresist etching mask may be deposited over copper layer 501, through which copper layer 501 is patterned by wet etch methods to form traces 105. In some embodiments, dry etching methods may be employed to form traces 105.

Holes 502 may be formed in package core 500 either before or after formation of traces 105. In some embodiments, holes 502 are formed by drilling methods. In some embodiments, holes 502 are formed by laser drilling, where infrared lasers such as carbon dioxide ($CO_2$) or neodymium-doped yttrium aluminum garnet (Nd:YAG) lasers are employed to ablate package core 500. The copper layer is not damaged when the laser penetrates through package core 500, and performs as a laser stop. Typically, laser-drilled holes are conical due to the radial gaussian distribution of laser energy.

Figure 5C:
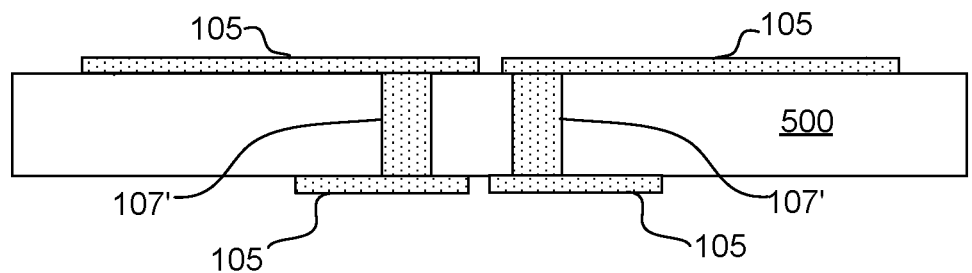

In the operation shown in FIG. 5C, through-vias 107' and traces 105 are formed by electroplating copper into holes 502. In some embodiments, a conductive seed layer is deposited over package core 500, which provides an electrode surface and performs as a conformal plating cathode. Through-vias 107' interconnect conductive structures on both sides of package core 500, and have a z-height that is the same or exceeds slightly the thickness of package core 500. In some embodiments, conductive structures such as traces 105 comprise copper having a thickness ranging between 15 microns and 35 microns. Traces 105 form a first conducive layer within package substrate 100.

Figure 5D:
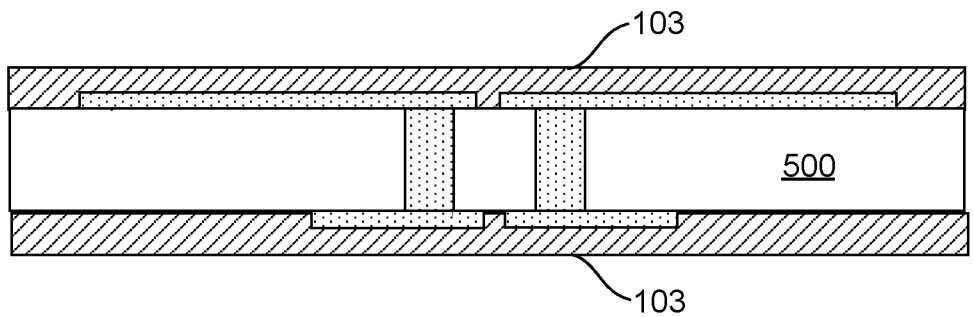

In the operation shown in FIG. 5D, dielectric layers 103 are laminated conformally over both sides of package core 500 and traces 105. Any suitable lamination method may be employed to form dielectric layers 103. In some embodiments, dielectric film layers 103 have thicknesses ranging from 20 to 40 microns. In some embodiments, dielectric film layers comprise polymer sheets composed of epoxies, polyimides or polyamides.

Figure 5E:
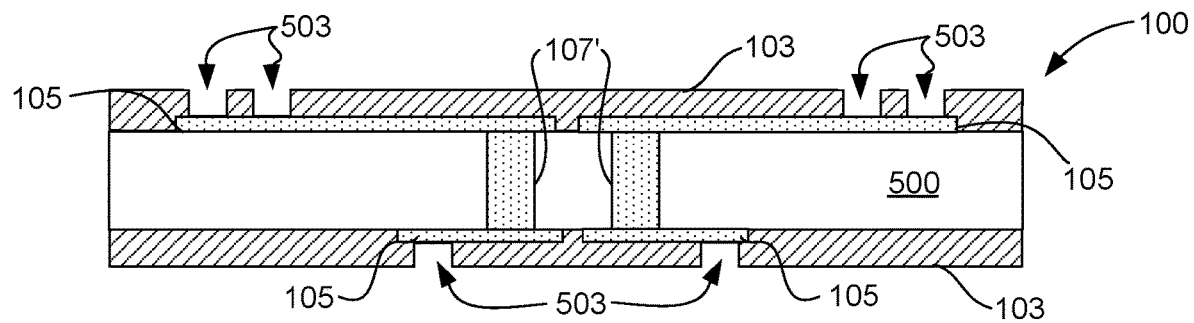

In the operation shown in FIG. 5E, holes 503 are formed in dielectric film layers 103 on both sides of package core 500. Holes 503 are formed in preparation of electrodeposition of through-vias 107' through dielectric layers 103. Holes 503 are openings exposing portions of traces 103, which provide conductive electrode surfaces on which to initiate electroplating. In some embodiments, holes 503 are formed by laser drilling as described above.

Figure 5F:
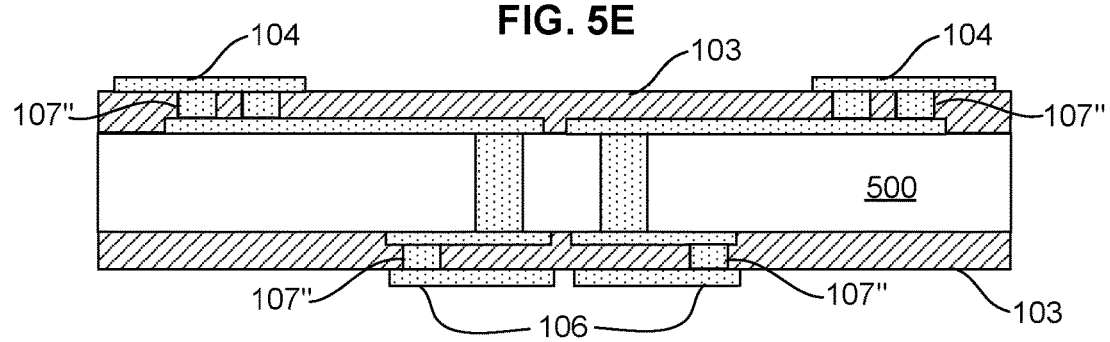

In the operation shown in FIG. 5F, a second conductive layer comprising traces 104 and 106, as well as vias 107" that interconnect intermediate traces 105 with surface bondpads 104 and 106, are formed over both dielectric layers 103 on each side of package core 500. In some embodiments, bondpads 104 and 106 are formed by electroplating a sheet of copper and patterning, as described above. In some embodiments, bondpads 104 are on the land side of package substrate 100, and bondpads 106 are on the die side of package core 500.

Figure 5G:
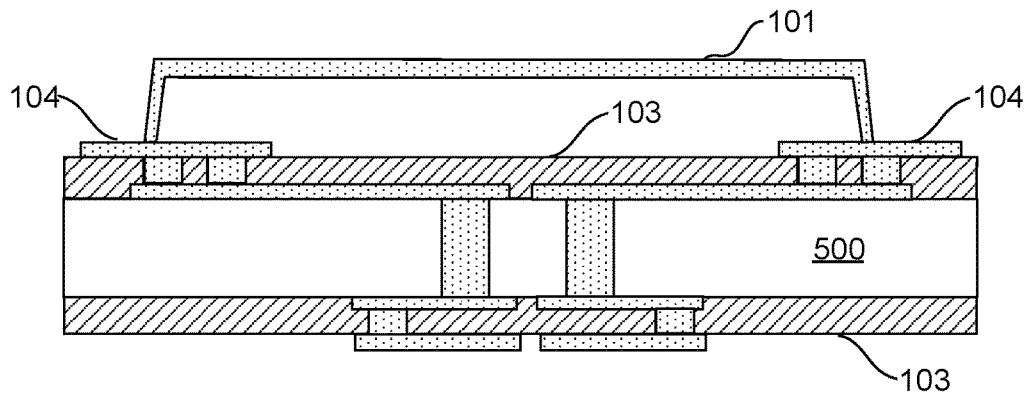

In the operation shown in FIG. 5G, wirebond inductor 101 is attached to bondpads 104. Wirebond inductor wire 101 is attached by suitable wirebonding techniques. In some embodiments, wirebond inductor 101 is a conventional wirebonding gold wire, and is bonded to bondpads 104 by wirebonding welds.

Figure 5H:
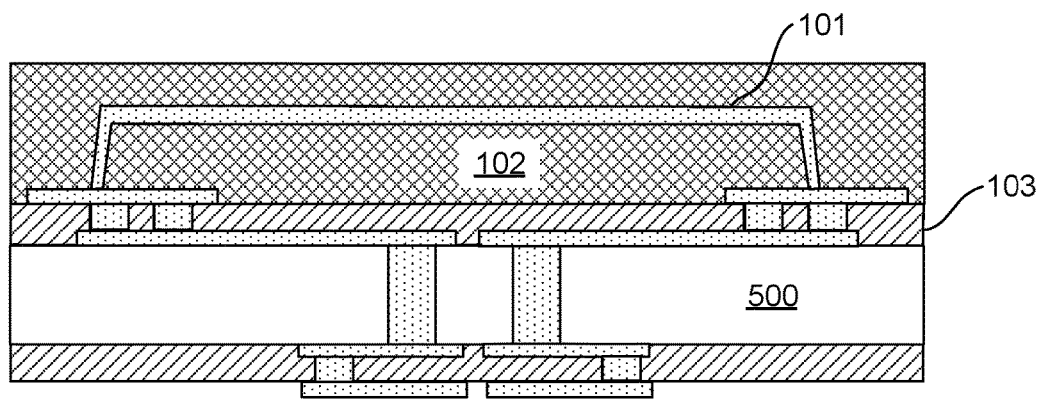

In the operation shown in FIG. 5H, inductor core layer 102 is formed over wire bond inductor 101 and dielectric layer 103 on the land side of package substrate 100. In some embodiments, inductor core layer 102 is formed by deposition of a magnetic ink in the form of a paste or liquid precursor material. In some embodiments, the precursor material is printed as an ink by ink-jet printing methods.

In some embodiments, the magnetic ink, which may have the consistency of a paste or liquid, is deposited in layers to build up a desired thickness of inductor core layer 102. In some embodiments, the ink material comprises a magnetic solid that is suspended in an uncured polymeric precursor material. Examples of particular compositions are described above. In some embodiments, the ink has a viscosity sufficient for it to hold its shape after printing.

In a subsequent operation, the ink or paste is solidified by a curing process. In some embodiments, the ink or paste is thermally cured. In some embodiments, the ink/paste comprises a photoinitiator and is optically cured by exposure to light (e.g., ultraviolet) to form inductor core layer 102. In some embodiments, inductor core layer 102 has a thickness of 150 microns.

Figure 6A:
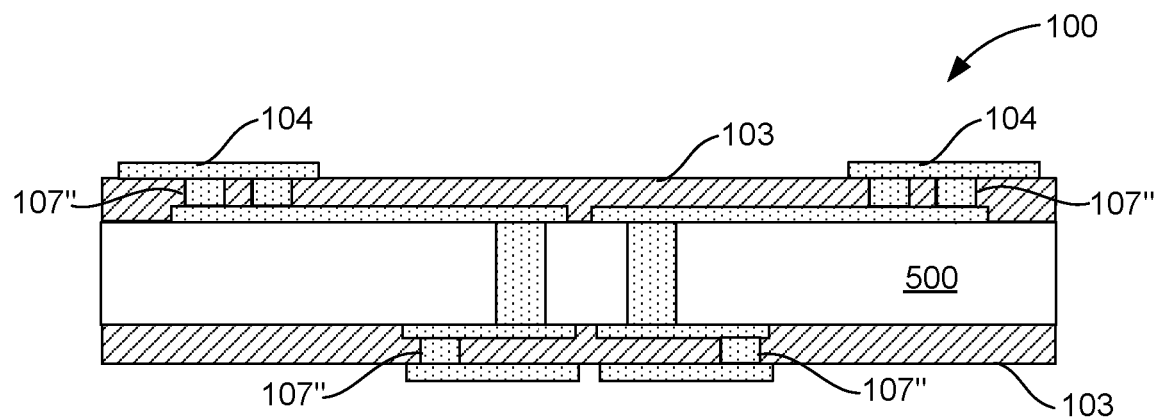
FIGS. 6A-6C illustrate a method for forming an integrated leadframe inductor on a package substrate, according to some embodiments of the disclosure.
Figure 6B:
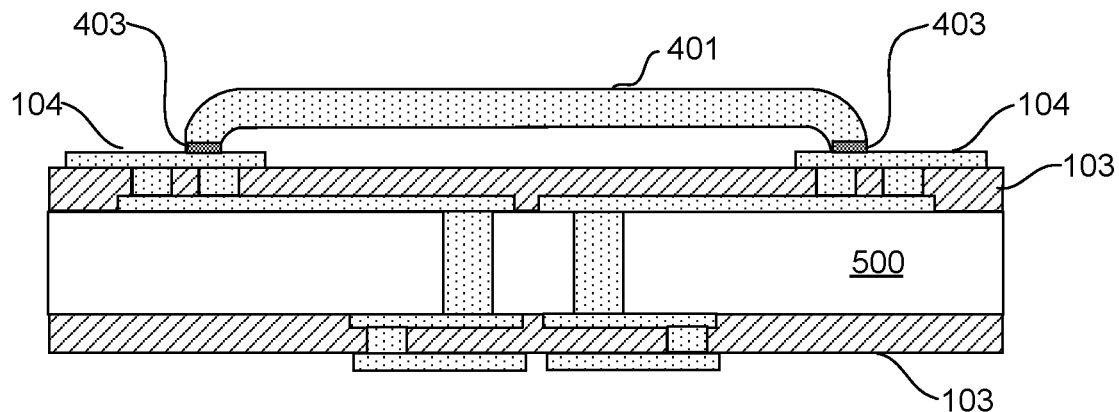
Figure 6C:
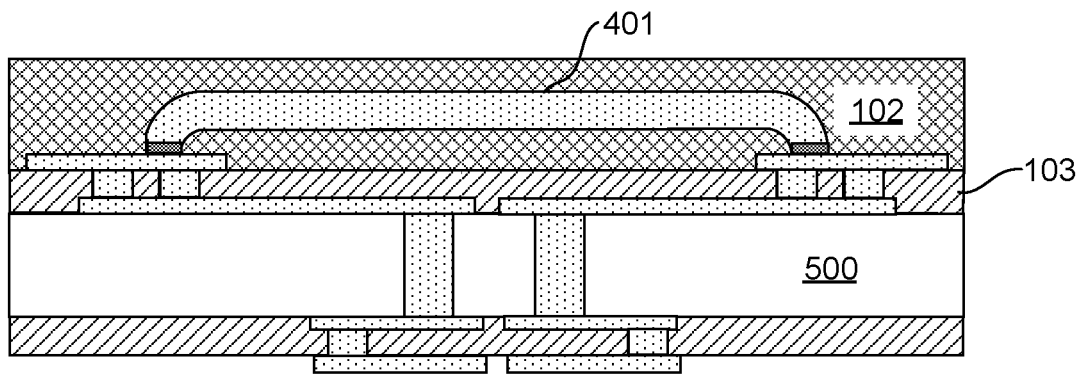

FIGS. 6A-6C illustrate a method for forming leadframe inductor 401 on package substrate 100, according to some embodiments of the disclosure.

In the operation shown in FIG. 6A, package substrate 100 is received in a partially assembled state. In some embodiments, package substrate 100 is received at the level of completion shown in FIG. 5F. The method as described for FIGS. 5A-5F may be applied to the formation of package substrate 100 as shown in FIG. 6A.

In the operation shown in FIG. 6B, leadframe inductor 401 is attached to package substrate 100. In some embodiments, leadframe inductor 401 is solder bonded to bondpads 104. Solder joints 403 may be formed by depositing a solder paste over bondpads 104. In some embodiments, leadframe inductor 401 is pre-formed by stamping pieces from a copper sheet. A pick-and-place operation may be employed to maneuver a pre-formed leadframe inductor wire (e.g., leadframe inductor wire 402 in FIG. 4A), over the solder paste. A reflow operation follows the pick-and-place operation, forming solder joints 403 between leadframe inductor 401 and bondpads 104.

In the operation shown in FIG. 6C, inductor core layer 102 is formed over leadframe inductor 401 and dielectric 103 on the land side of package substrate 100. In some embodiments, formation of inductor core layer 102 is the same as described for wirebond inductor 101, described for FIG. 5H.

Figure 7:
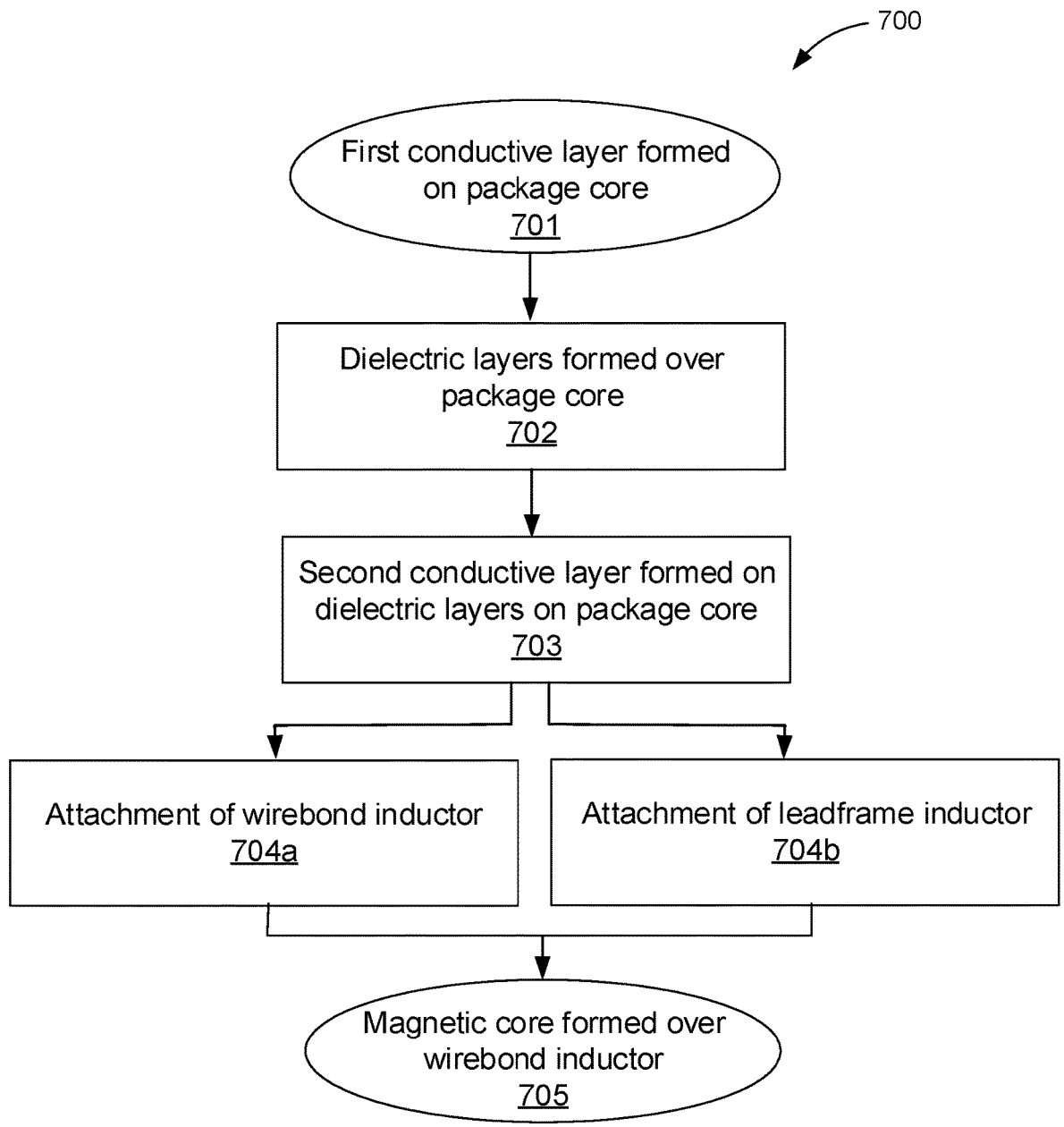
FIG. 7 illustrates a flow chart summarizing the methods for forming a package-integrated wirebond inductor or leadframe inductor, as illustrated in FIGS. 5A-5H and FIGS. 6A-6C, according to some embodiments of the disclosure.

FIG. 7 illustrates flow chart 700 summarizing the methods for forming package-integrated wirebond inductor 101 or leadframe inductor 401, as illustrated in FIGS. 5A-5H and FIGS. 6A-6C, according to some embodiments of the disclosure.

At operation 701, a first conductive layer is formed over both sides of a package core (e.g., package core 500). A layer of copper may be electroplated over each side of a fiberglass or glass package core. The copper layer may be patterned by lithographic techniques. In some embodiments, an etch mask is formed over the copper layer by depositing a photoresist and forming a negative pattern. The copper may be etched by wet etch methods through openings in the photoresist mask to form conductive structures such as traces 105.

Holes are made in the package core in preparation of deposition of through-vias (e.g., through-vias 107') extending through package core 500. Laser drilling methods may be employed to form holes in the package core.

At operation 702, dielectric layers are deposited over copper structures on each side of the package core. In some embodiments, dielectric layers are epoxy (or other polymers) laminate films used in build-up package assembly. Suitable lamination methods may be employed.

At operation 703, a second conductive layer is formed over the dielectric layers formed in the previous operation. In some embodiments, the conductive layer is formed from electroplated copper. Vias (e.g., vias 107") are formed during this step. Prior to electrodeposition of the copper layer, holes may be formed in the dielectric layer over traces 105 where vias are to be formed.

A conductive seed layer may be deposited over the dielectric layers and into the holes formed in the dielectric prior to the copper electrodeposition operation. Vias 107" and a copper layer are deposited to form the second conductive layer in the holes and over the dielectric layers on both sides of the package core. The second copper layer is than patterned to form conductive structures such as bondpads 104 on the land side and 106 on the die side.

At this stage, flowchart 700 bifurcates for formation of a wirebond inductor or formation of a leadframe inductor.

At operation 704a, a wirebond inductor is formed by attachment of a bondwire (e.g., bondwire 101) onto bondpads (e.g., bondpads 104) on the land side of the package substrate. A wirebond trace is made by conventional wirebonding techniques, attaching a gold bondwire to the land side bondpads.

At operation 704b, a leadframe inductor is formed by attachment of a leadframe wire (e.g., leadframe wire 402). The leadframe wire is formed by stamping the form from copper sheet metal, and attached by a pick-and-place operation to position the leadframe wire over bondpads (e.g., bondpads 104). Solder paste has been printed over the bondpads in a previous operation. A reflow operation may then be performed to form solder bonds between the leadframe wire and the bondpads.

At operation 705, a magnetic core (e.g., magnetic core 102) may be formed by an inkjet printing process, where magnetic material in the form of a liquid or paste ink is printed over the inductor.

Figure 8:
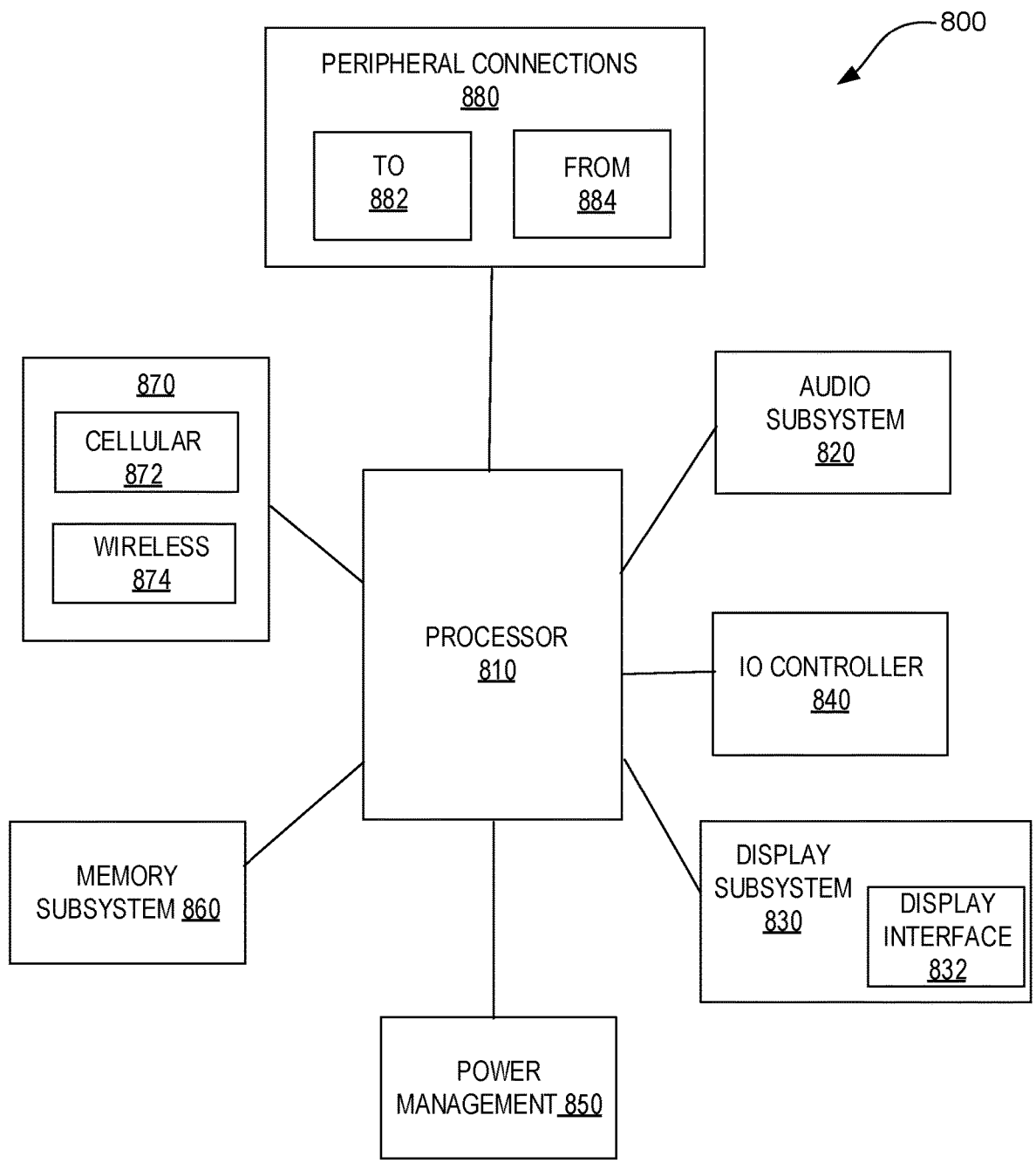
FIG. 8 illustrates a package having integrated wirebond or leadframe inductors, fabricated according to the disclosed methods, as part of a system-on-chip (SoC) package in an implementation of computing device, according to some embodiments of the disclosure.

FIG. 8 illustrates a package having integrated wirebond inductors (e.g. wirebond inductor 101) or leadframe inductors (e.g., leadframe inductor 401), fabricated according to the disclosed methods, as part of a system-on-chip (SoC) package in an implementation of computing device, according to some embodiments of the disclosure.

FIG. 8 illustrates a block diagram of an embodiment of a mobile device in which integrated wirebond inductors (e.g., wirebond inductor 101) or leadframe inductors (e.g., leadframe inductor 401) could be used. In some embodiments, computing device 800 represents a mobile computing device, such as a computing tablet, a mobile phone or smart-phone, a wireless-enabled e-reader, or other wireless mobile device. It will be understood that certain components are shown generally, and not all components of such a device are shown in computing device 800.

In some embodiments, computing device 800 includes a first processor 810 that comprises at least one FIVR. The various embodiments of the present disclosure may also comprise a network interface within 870 such as a wireless interface so that a system embodiment may be incorporated into a wireless device, for example, cell phone or personal digital assistant.

In one embodiment, processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting the computing device 800 to another device. The processing operations may also include operations related to audio I/O and/or display I/O.

In one embodiment, computing device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 800, or connected to the computing device 800. In one embodiment, a user interacts with the computing device 800 by providing audio commands that are received and processed by processor 810.

Display subsystem 830 represents hardware (e.g., display devices) and software (e.g., drivers) components that provide a visual and/or tactile display for a user to interact with the computing device 800. Display subsystem 830 includes display interface 832 which includes the particular screen or hardware device used to provide a display to a user. In one embodiment, display interface 832 includes logic separate from processor 810 to perform at least some processing related to the display. In one embodiment, display subsystem 830 includes a touch screen (or touch pad) device that provides both output and input to a user.

I/O controller 840 represents hardware devices and software components related to interaction with a user. I/O controller 840 is operable to manage hardware that is part of audio subsystem 820 and/or display subsystem 830. Additionally, I/O controller 840 illustrates a connection point for additional devices that connect to computing device 800 through which a user might interact with the system. For example, devices that can be attached to the computing device 800 might include microphone devices, speaker or stereo systems, video systems or other display devices, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of the computing device 800. Additionally, audio output can be provided instead of, or in addition to display output. In another example, if display subsystem 830 includes a touch screen, the display device also acts as an input device, which can be at least partially managed by I/O controller 840. There can also be additional buttons or switches on the computing device 800 to provide I/O functions managed by I/O controller 840.

In one embodiment, I/O controller 840 manages devices such as accelerometers, cameras, light sensors or other environmental sensors, or other hardware that can be included in the computing device 800. The input can be part of direct user interaction, as well as providing environmental input to the system to influence its operations (such as filtering for noise, adjusting displays for brightness detection, applying a flash for a camera, or other features).

In one embodiment, computing device 800 includes power management 850 that manages battery power usage, charging of the battery, and features related to power saving operation. Memory subsystem 860 includes memory devices for storing information in computing device 800. Memory can include nonvolatile (state does not change if power to the memory device is interrupted) and/or volatile (state is indeterminate if power to the memory device is interrupted) memory devices. Memory subsystem 860 can store application data, user data, music, photos, documents, or other data, as well as system data (whether long-term or temporary) related to the execution of the applications and functions of the computing device 800.

Elements of embodiments are also provided as a machine-readable medium (e.g., memory 860) for storing the computer-executable instructions. The machine-readable medium (e.g., memory 860) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 870 includes hardware devices (e.g., wireless and/or wired connectors and communication hardware) and software components (e.g., drivers, protocol stacks) to enable the computing device 800 to communicate with external devices. The computing device 800 could be separate devices, such as other computing devices, wireless access points or base stations, as well as peripherals such as headsets, printers, or other devices.

Network interface 870 can include multiple different types of connectivity. To generalize, the computing device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 874 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 880 include hardware interfaces and connectors, as well as software components (e.g., drivers, protocol stacks) to make peripheral connections. It will be understood that the computing device 800 could both be a peripheral device ("to" 882) to other computing devices, as well as have peripheral devices ("from" 884) connected to it. The computing device 800 commonly has a "docking" connector to connect to other computing devices for purposes such as managing (e.g., downloading and/or uploading, changing, synchronizing) content on computing device 800. Additionally, a docking connector can allow computing device 800 to connect to certain peripherals that allow the computing device 800 to control content output, for example, to audiovisual or other systems.

In addition to a proprietary docking connector or other proprietary connection hardware, the computing device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A microelectronics package, comprising:
a substrate comprising a first bondpad and a second bondpad over a dielectric;
an inductor comprising at least one wire extending over the dielectric, the at least one wire having a first end coupled to the first bondpad and a second end coupled to the second bondpad; and
an inductor core layer over the dielectric, the inductor core layer comprising a magnetic material, wherein at least a portion of the inductor core layer is over the at least one wire and at least a portion of the inductor core layer is between the dielectric and the at least one wire.

2. The microelectronics package of claim 1, wherein the inductor core layer completely surrounds a length of the at least one wire that is substantially parallel to an interface between the inductor core layer and the dielectric, wherein the first end and the second end of the wire comprise a bend toward the dielectric, wherein the first bondpad is substantially coplanar with the second bondpad and wherein the first end is bonded to the first bondpad and the second end is bonded to the second bondpad.

3. The microelectronics package of claim 1, wherein the at least one wire comprises a bondwire having substantially circular cross section, and wherein the first bond pad is electrically coupled to a first conductive via extending through the dielectric and the second bondpad is electrically coupled to a second conductive via extending through the dielectric.

4. The microelectronics package of claim 1, wherein the at least one wire comprises a leadframe wire having a substantially rectilinear cross section, wherein the leadframe wire has a first end and a second end, and wherein a first solder joint is between the first end and the first bondpad, and a second solder joint is between the second end and the second bondpad, and wherein the first bond pad is electrically coupled to a first conductive via extending through the dielectric and the second bondpad is electrically coupled to a second conductive via extending through the dielectric.

5. The microelectronics package of claim 1, wherein the bondwire comprises gold or copper.

6. The microelectronics package of claim 1, wherein the dielectric is over a core material and wherein the first bond pad is electrically coupled to a third bondpad on an opposite side of the substrate through a first through-core conductive via, and wherein the second bondpad is electrically coupled to a fourth bondpad on the opposite side of the substrate through a second through-core conductive via.

7. The microelectronics package of claim 1, wherein the magnetic material comprises magnetic particles within an insulating non-magnetic matrix.

8. The microelectronics package of claim 7, wherein the magnetic particles comprises at least one of iron, nickel, cobalt, manganese, molybdenum, lanthanide elements or actinide elements.

9. The microelectronics package of claim 7, wherein the insulating non-magnetic matrix comprises at least one of an epoxy resin, polyamide resin, polyimide resin or a polysulfone resin.

10. The microelectronics package of claim 1, wherein the magnetic material has a relative magnetic permeability of at least 5.

11. The microelectronics package of claim 1, wherein the inductor core layer extends to a z-height above the dielectric, and wherein the at least one wire extends through the inductor core layer at a z-height over the dielectric that is greater than one half of the z-height of the inductor core layer.

12. A system, comprising:
a substrate comprising a first bondpad and a second bondpad over a dielectric on a first side of the substrate;
an inductor comprising at least one wire extending over the dielectric, the at least one wire having a first end coupled to the first bondpad and a second end coupled to the second bondpad; and an inductor core layer over the dielectric, the inductor core layer comprising a magnetic material, wherein at least a portion of the inductor core layer is over the at least one wire and at least a portion of the inductor core layer is between the dielectric and the at least one wire; and
a die coupled to a second side of the substrate, opposite the first side, and wherein the die is electrically coupled to the inductor by third and fourth bondpads on the second side of the substrate.

13. The system of claim 12, wherein the die comprises a microprocessor having a power rail coupled to the inductor.

14. The system of claim 12, wherein the die comprises an integrated voltage regulator circuit, and wherein the inductor is coupled to the integrated voltage regulator circuit.

15. The system of claim 12, wherein the at least one wire comprises two or more adjacent wires, each comprising a first end and a second end, wherein the first end of the two or more adjacent wires are coupled together at the first bondpad, and wherein the second end of the two or more adjacent wires are coupled together at the second bondpad.

16. The system of claim 12, wherein the at least one wire comprises two or more wires, wherein the two or more wires are parallel to each other and wherein the two or more wires are coupled in electrical series between the first and second bondpads.

17. The system of claim 12, wherein the inductor comprises two or more inductor loops, wherein the two or more inductor loops are adjacent to each other and wherein the two or more inductor loops are coupled to the die in electrical parallel.

* * * * *